United States Patent
Tang

(10) Patent No.: US 9,887,254 B2
(45) Date of Patent: Feb. 6, 2018

(54) DOUBLE-SIDE OLED DISPLAY

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/201,441

(22) Filed: Jul. 2, 2016

(65) Prior Publication Data

US 2017/0330926 A1    Nov. 16, 2017

(30) Foreign Application Priority Data

May 10, 2016    (CN) .................. 2016 2 04206845 U

(51) Int. Cl.
| | | |
|---|---|---|
| *H01L 29/08* | (2006.01) | |
| *H01L 27/32* | (2006.01) | |
| *H01L 51/52* | (2006.01) | |

(52) U.S. Cl.
CPC ...... *H01L 27/3267* (2013.01); *H01L 51/5259* (2013.01); *H01L 2251/5338* (2013.01); *H01L 2251/558* (2013.01)

(58) Field of Classification Search
CPC .... A61H 31/00; A61H 31/007; A61H 31/008; H01L 51/50

USPC .......................................................... 257/40
See application file for complete search history.

(56) References Cited

U.S. PATENT DOCUMENTS

| | | | | |
|---|---|---|---|---|
| 2007/0153207 A9* | 7/2007 | Sung | ................... | G02F 1/13452 349/149 |
| 2010/0118522 A1* | 5/2010 | Hente | ..................... | F21K 99/00 362/190 |
| 2014/0002331 A1* | 1/2014 | Yoo | ....................... | G09G 3/3208 345/76 |
| 2015/0076474 A1* | 3/2015 | Kao | ..................... | H01L 51/5284 257/40 |
| 2015/0241925 A1* | 8/2015 | Seo | ....................... | G06F 1/1652 361/679.27 |
| 2016/0351852 A1* | 12/2016 | Kim | .................... | H01L 51/5256 |

* cited by examiner

*Primary Examiner* — Long K Tran
(74) *Attorney, Agent, or Firm* — Andrew C. Cheng

(57) ABSTRACT

A double-side OLED display is disclosed. The double-side OLED display includes a base layer and an OLED layer disposed on the base layer. The OLED layer includes a first display region and a second display region. The base layer and the OLED layer are folded such that the first display region and the second display region respectively face toward opposite directions; the base layer is located at an outside. The present invention can simplify the production process, increase the production capacity, decrease the thickness of the product, and sufficiently utilizing the base layer such that the base layer can protect the OLED layer. Besides, because the displaying at both sides is emitting at a bottom, the base layer located at outside can provide a flat display surface to improve the display quality.

12 Claims, 7 Drawing Sheets

DOUBLE-SIDE OLED DISPLAY

BACKGROUND OF THE INVENTION

1. Field of the Invention

The present invention relates to an OLED display technology field, and more particularly to a double-side OLED display.

2. Description of Related Art

The form of the electric production is gradually become diverse, and a double-side display function becomes an important feature of the next generation electric product.

For example, a double-side display device inside a cell phone can display main function of the cell phone at one side, and display time at the other side. For example, using a double-side display in a public area to show various contents for persons at two sides of the display. Currently, the double-side display is usually formed by adhering two display panels. For example, a liquid crystal display panel and an organic light-emitting panel are adhered together or two organic light-emitting panels are adhered together.

The above double-side display increases an adhering process of two panels such that the production process is complicated. Besides, the thickness of the product formed by adhering is large, which is not conducive for thinning of the product.

SUMMARY OF THE INVENTION

The present invention provides a double-side OLED display, which can solve the problems of complicated production process and thick product existed in the conventional art.

In order to solve the above technology problem, a technology solution adopted by the present invention is: a double-side OLED display, comprising: a base layer; and an OLED layer disposed on the base layer; wherein, the OLED layer includes a first display region and a second display region; the base layer and the OLED layer are folded such that the first display region and the second display region respectively face toward opposite directions; the base layer is located at an outside.

Wherein, before the base layer and the OLED layer are folded, the first display region and the second display region are arranged adjacently; a folding region is disposed between the first display region and the second display region for folding along the folding region.

Wherein, a packaging layer is disposed on the OLED layer.

Wherein, a terminal of the double-side OLED display corresponding to the folding region is fixed with a packaging material for performing a packaging to the double-side OLED display.

Wherein, a thickness of the folding region is less than a thickness of a region where the first display region and the second display region is located.

Wherein, a thickness of the base layer at the folding region is less than a thickness of the base layer corresponding to the first display region and the second display region.

Wherein, an area of the first display region and an area of the second display region are the same, or; the area of the first display region and the area of the second display region are different.

Wherein, the first display region and the second display region commonly use a soldering pad region; the soldering pad region is disposed at a side of the first display region or disposed at a side of the second display region.

Wherein, each of the first display region and the second display region has a soldering pad region; the soldering pad region of the first display region is a first soldering pad region; the soldering pad region of the second display region is a second soldering pad region; the first soldering pad region and the second soldering pad region are disposed at a same side of the first display region and the second display region or different sides.

Wherein, a drier is disposed between the first display region and the second display region.

The beneficial effects of the present invention are: through folding the base layer and the OLED layer disposed on the base layer such that the first display region and the second display region on the OLED layer respectively face opposite directions in order to achieve a double-side display. Accordingly, separating of the first display region and the second display region in the production process is not required in order to reduce a cutting length in the production process and improve production capacity. Besides, in the manufacturing process, only requiring folding without adhering two panels so as to simplify the process and decrease a thickness of the product. Furthermore, the base layer of the present invention is located at the outside such that the base layer can protect the OLED layer. Besides, because the double-side display is emitted at the bottom, the base layer located at the outside further provides a flat display surface to improve the display quality.

DETAILED DESCRIPTION OF THE PREFERRED EMBODIMENT

The following content combines with the drawings and the embodiment for describing the present invention in detail.

Figure 1:
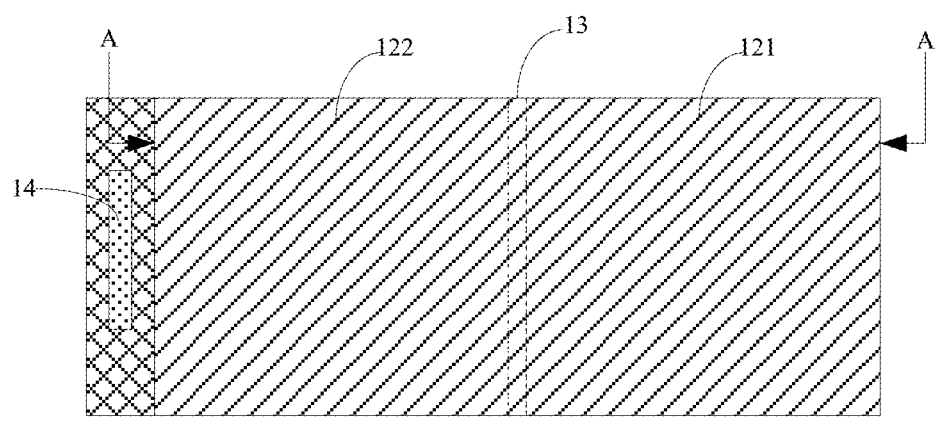
FIG. 1 is a schematic diagram of a double-side OLED display before folding of a first embodiment of the present invention.
Figure 2:
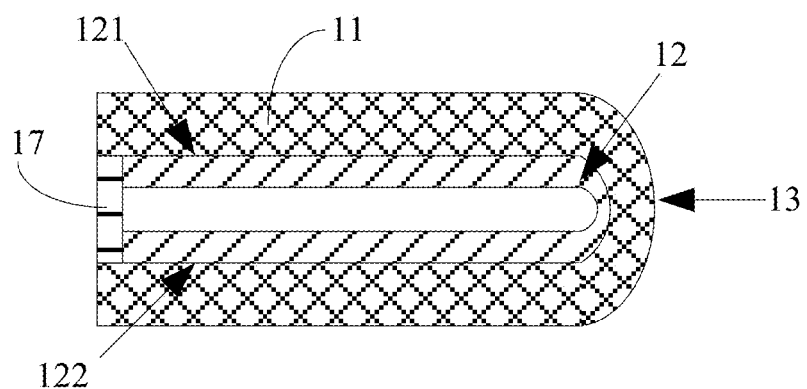
FIG. 2 is a schematic diagram of the double-side OLED display after folding of a first embodiment of the present invention.

With reference to FIG. 1 and FIG. 2, FIG. 1 is a schematic diagram of a double-side OLED display before folding of a first embodiment of the present invention; and FIG. 2 is a schematic diagram of the double-side OLED display after folding of a first embodiment of the present invention.

The double-side OLED display of the present invention includes a base layer 11 and an OLED layer 12 disposed on the base layer 11. Wherein, the OLED layer 12 includes a first display region 121 and a second display region 122. The base layer 11 and the OLED layer 12 are folded such that the first display region 121 and the second display region 122 respectively face toward opposite directions in order to achieve a double-side display. Besides, the base layer 11 is located at an outer side in order to protect the OLED layer 12.

The double-side OLED display of the present invention forms a double-side display through folding. In the manufacturing process, when cutting the OLED layer 12 where the first display region 121 and the second display region 122 are located and the corresponding base layer 11 can be cut integrally without separating the first display region 121 and the second display region 122. After cutting, folding the OLED layer 12 where the first display region 121 is located and the corresponding base layer 11 and the OLED layer 12 where the second display region 122 is located and the corresponding base layer 11 in order to obtain a double-side display. Besides, in the OLED display, the OLED layer 12 is located at an inside, and an outer side of the OLED layer 12 is surrounded by the base layer 11 in order to protect the OLED layer 12.

Comparing to the conventional art, the present invention through folding the base layer 11 and the OLED layer 12 located on the base layer 11 such that the first display region 121 and the second display region 122 on the OLED layer 12 respectively face toward opposite directions in order to achieve a double-side display so that in the manufacturing process, separating the first display region 121 and the second display region 122 is not required so as to reduce a cutting length in the production process and improve production capacity. Besides, in the manufacturing process, only requiring folding without adhering two panels so as to simplify the process and decrease a thickness of the product. Furthermore, the base layer 11 of the present invention is located at outside such that the base layer 11 can protect the OLED layer 12. Besides, because the double-side display are emitted at the bottom, the base layer 11 located at the outside further provides a flat display surface to improve the display quality.

In the present invention, before the base layer 11 and the OLED layer 12 are folded, the first display region 121 and the second display region 122 are arranged adjacently. A folding region 13 is disposed between the first display region 121 and the second display region 122 for folding along the folding region 13.

Figure 3:
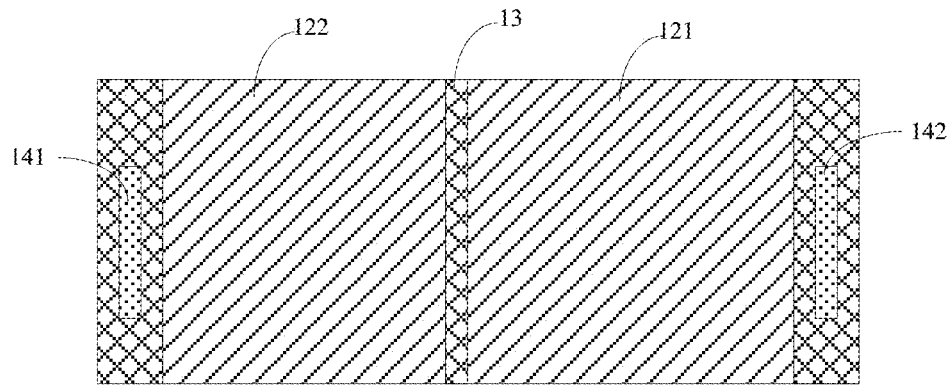
FIG. 3 is a schematic diagram of a double-side OLED display before folding of another situation of a first embodiment of the present invention, which shows an area of the first display region is greater than an area of the second display region.
Figure 4:
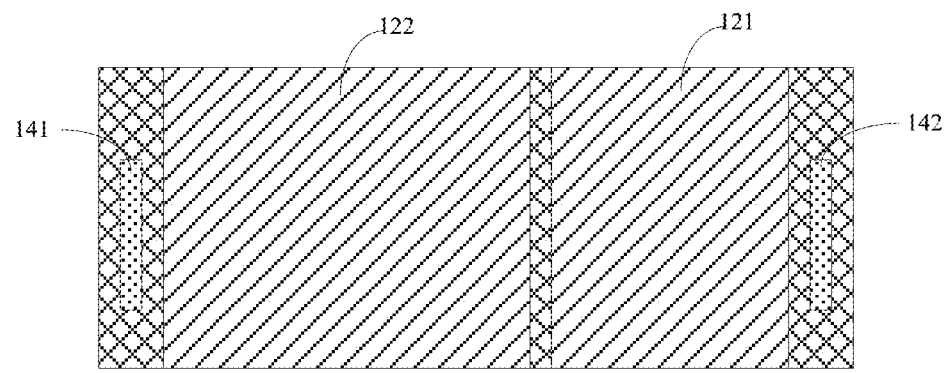
FIG. 4 is a schematic diagram of a double-side OLED display before folding of another situation of a first embodiment of the present invention, which shows that an area of the first display region is less than an area of the second display region.

In should be noted that an area of the first display region 121 and an area of the second display region 122 can be the same, as shown in FIG. 1, of course, an area of the first display region 121 and an area of the second display region 122 can also be different, as shown in FIG. 3 and FIG. 4. Wherein, FIG. 3 is a schematic diagram of a double-side OLED display before folding of another situation of a first embodiment of the present invention. An area of the first display region is greater than an area of the second display region. FIG. 4 is a schematic diagram of a double-side OLED display before folding of another situation of a first embodiment of the present invention. An area of the first display region is less than an area of the second display region.

Besides, the first display region 121 and the second display region 122 can commonly use a soldering pad region 14. The soldering pad region 14 is connected with a flexible circuit board, and through the flexible circuit board to connect an integrated circuit, a signal control system or a signal input terminal. The soldering pad region 14 is disposed at a side of the first display region 121, as shown in FIG. 1, Of course, in another embodiment, the soldering pad region 14 is disposed at a side of the second display region 122. Wherein, a location of the soldering pad region 14 can be at a long side or a short side in FIG. 1, not limited here.

In can be understood that each of the first display region 121 and the second display region 122 can have a soldering pad region 14. Wherein, the soldering pad region of the first display region 121 is a first soldering pad region 141, the soldering pad region of the second display region 122 is a second soldering pad region 142. The first soldering pad region 141 and the second soldering pad region 142 can be disposed at a same side of the first display region 121 and the second display region 122 or different sides as shown in FIG. 3 and FIG. 4. The first soldering pad region 141 and the second soldering pad region 142 are respectively disposed at different sides of the first display region 121 and the second display region 122.

Figure 5:
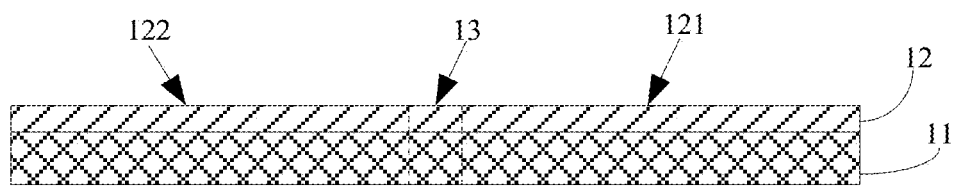
FIG. 5 is a cross-sectional view of A-A portion shown in FIG. 1.

With reference to FIG. 5, and FIG. 5 is a cross-sectional view of A-A portion shown in FIG. 1.

The base layer 11 and the OLED layer 12 of the present embodiment are not packaged before folding. After being folded, a terminal of the first display region 121 and a terminal of the second display region 122 are fixed with a packaging material 17 in order to performing a packaging for the double-side OLED display, as shown in FIG. 2. Performing the packaging after folding can simplify the packaging process and reduce the amount of moisture or oxygen entering into. Specifically, the packaging material 17 can be a UV adhesive or a laser melting glass adhesive.

In should be noted that, the angle/radian of the folding region 13 in FIG. 2 is only a schematic diagram of the present embodiment, and is determined by the material of the panel or the design.

Besides, for conveniently bending and folding the folding region 13, the design of the folding region 13 can be improved. In the present embodiment, a thickness of the folding region 13 is less than a thickness of a region where the first display region 121 and the second display region 122 is located.

Figure 6:
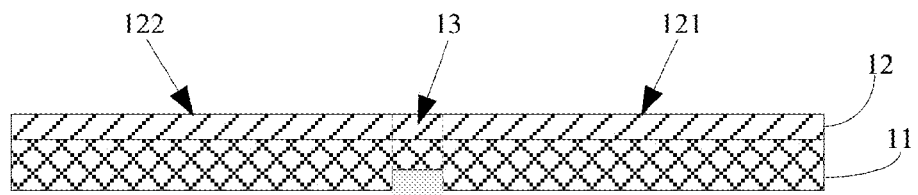
FIG. 6 is a schematic cross-sectional view of the double-side OLED display of an embodiment of the present invention, which shows that the folding region includes the base layer and the OLED layer, and the thickness of the substrate layer at the folding region is less than the thickness of the base layer at the other regions.

For example, the folding region 13 includes a base layer 11 and an OLED layer 12. A thickness of the substrate layer 11 at the folding region 13 is less than a thickness of the substrate layer 11 corresponding to the first display region 121 and the second display region 122. The above can be realized by thinning the substrate layer 11 at the folding region 13 such that the thickness of the substrate layer 11 at the folding region 13 is less than the thickness of the substrate layer 11 corresponding to the first display region 121 and the second display region 122 for conveniently bending. As shown in FIG. 6, and FIG. 6 is a schematic cross-sectional view of the double-side OLED display of an embodiment of the present invention. As shown, the folding region includes the base layer and the OLED layer, and the thickness of the substrate layer at the folding region is less than the thickness of the base layer at the other regions.

Figure 7:
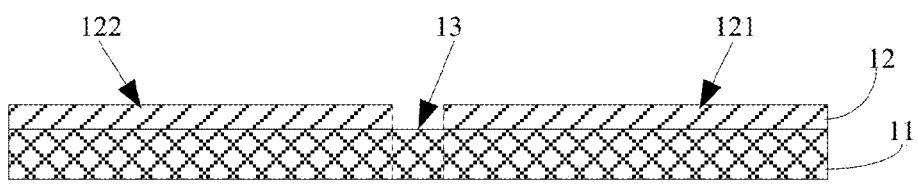
FIG. 7 is a schematic cross-section view of the double-side OLED display of the first embodiment of the present invention, which shows that the folding region only includes the base layer, and the thickness of the base layer at the folding region is equal to the thickness of the base layer at the other regions.

Or, the folding region 13 only includes the base layer 11, a thickness of the base layer 11 corresponding to the folding region 13 is the same as a thickness of the base layer 11 corresponding to the other regions, but the folding region 13 does not includes the OLED layer 12. The regions where the first display region 121 and the second display region 122 are located include the base layer 11 and the OLED layer 12 such that the thickness of the folding region 13 is less than the other regions for conveniently bending. As shown in FIG. 7, and FIG. 7 is a schematic cross-section view of the double-side OLED display of the first embodiment of the present invention. As shown, the folding region only includes the base layer, and the thickness of the base layer at the folding region is equal to the thickness of the base layer at the other regions.

Figure 8:
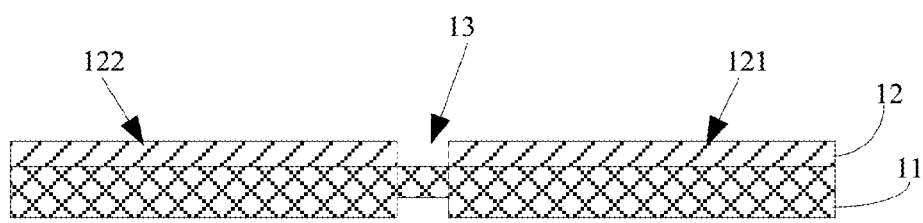
FIG. 8 is a schematic cross-section view of the double-side OLED display of the first embodiment of the present invention, which shows that the folding region only provides with the base layer, and the thickness of the base layer at the folding region is less than the thickness of the base layer at the other regions.

Or, for conveniently bending, the present invention can reduce the thickness of the base layer 11 at the folding region 13 based on FIG. 7, as shown in FIG. 8. FIG. 8 is a schematic cross-section view of the double-side OLED display of the first embodiment of the present invention. As shown, the folding region only provides with the base layer, and the thickness of the base layer at the folding region is less than the thickness of the base layer at the other regions.

Figure 9:
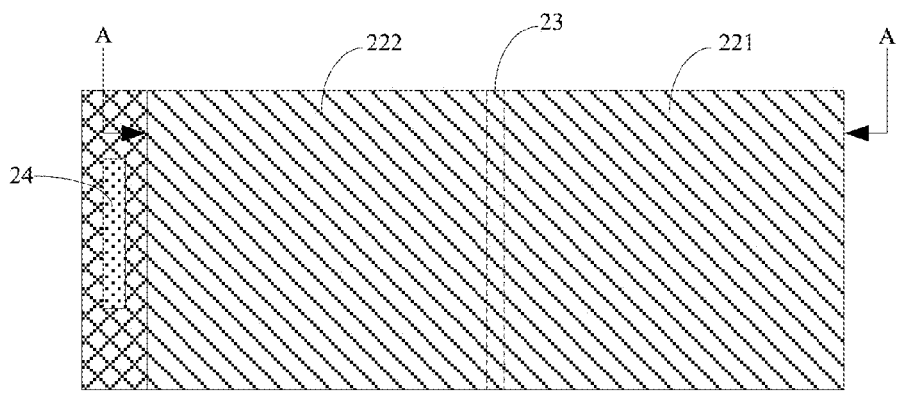
FIG. 9 is a schematic cross-section view of the double-side OLED display of a second embodiment of the present invention.
Figure 10:
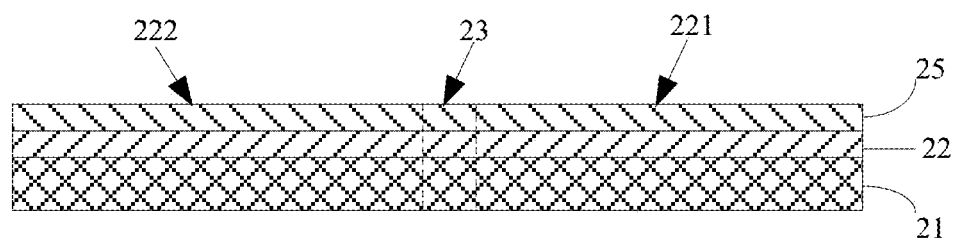
FIG. 10 is a schematic cross-sectional view at A-A portion in FIG. 9.
Figure 11:
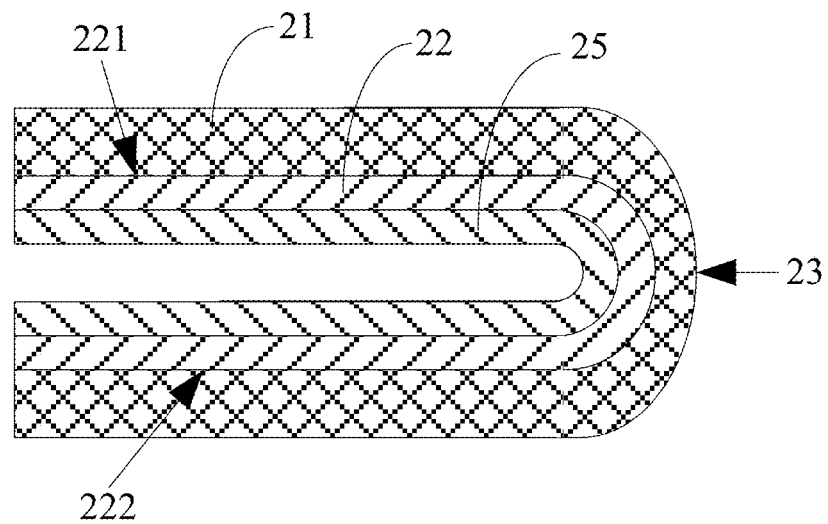
FIG. 11 is a schematic diagram of the structure in FIG. 10 after being folded.

With reference to FIG. 9, and FIG. 9 is a schematic cross-section view of the double-side OLED display of a second embodiment of the present invention. As shown in FIG. 10, and FIG. 10 is a schematic cross-sectional view at A-A portion in FIG. 9. As shown in FIG. 11, and FIG. 11 is a schematic diagram of the structure in FIG. 10 after being folded.

The double-side OLED display of the present embodiment includes a base layer 21, an OLED layer 22 disposed on the base layer 21 and a packaging layer 25. The packaging layer 25 is disposed on the OLED layer 22.

Wherein, the OLED layer includes a first display region 221 and a second display region 222. The base layer 21, the OLED layer 22 and the packaging layer 25 are folded at the same time such that the first display region 221 and the second display region 222 respectively face different directions in order to realize a double-side display. The persons at two sides of the display can see the displayed content. The base layer 21 is located at the outside in order to protect the OLED layer 22.

In the present embodiment, before the base layer 21 and the OLED layer 22 are folded, the packaging layer 25 is already formed on the OLED layer 22. Wherein, the package is a cover package or a thin-film package.

Figure 12:
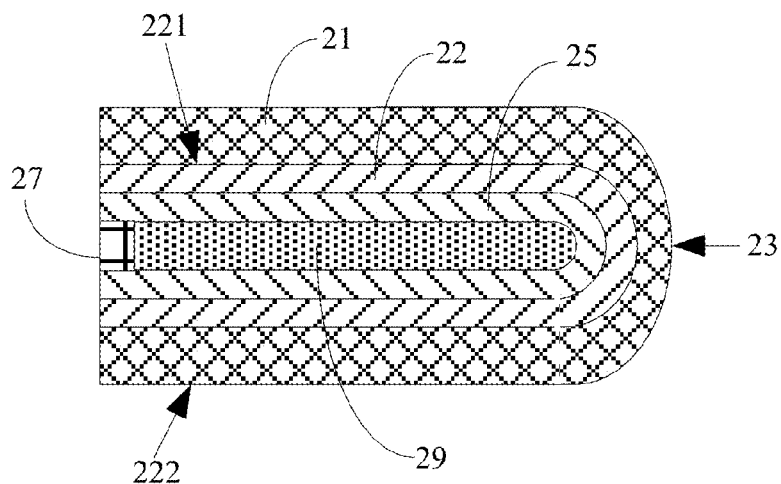
FIG. 12 is a schematic diagram of one situation of the double-side OLED display after being folded of the present invention.

In another embodiment, after the base layer 21, the OLED layer 22 and the packaging layer 25 are folded, a terminal of the double-side OLED display corresponding to the folding region is fixed with a packaging material 27 for performing a packaging to the folded double-side OLED display again, as shown in FIG. 12, and FIG. 12 is a schematic diagram of one situation of the double-side OLED display after being folded of the present invention.

Figure 13:
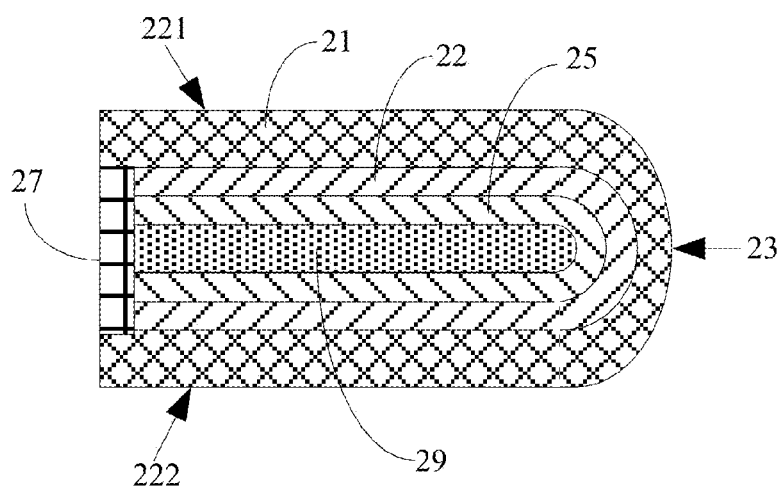
FIG. 13 is a schematic diagram of another situation of the double-side OLED display after being folded of the present invention.

Specifically, as shown in FIG. 12, the packaging material 27 is fixed at the packaging layer 25 corresponding to the first display region 221 and the packaging layer 25 corresponding to the second display region 222. Besides, the packaging layer 25 and the OLED layer 22 at terminals of the first display region 221 and the second display region 222 can fix the packaging material 27 by a preset position, as shown in FIG. 13. FIG. 13 is a schematic diagram of another situation of the double-side OLED display after being folded of the present invention.

After being folded, the packaging layer 25 corresponding to the first display region 221 and the packaging layer 25 corresponding to the second display region 222 can reserve a gap. With reference to FIG. 12 and FIG. 13, in order to reduce the amount of the moisture and oxygen, the gap between the first display region 221 and the second display region 222 is filled with a drier 29 in order to extend the life of the OLED display.

In another embodiment, the packaging layer 25 corresponding to the first display region 221 and the packaging layer 25 corresponding to the second display region 222 can be adhered tightly together after being folded.

Before the base layer 21 and the OLED layer 22 are folded, the first display region 221 and the second display region 222 are arranged adjacently, a folding region 23 is disposed between the first display region 221 and the second display region 222 for folding along the folding region 23.

In should be noted that an area of the first display region 221 and an area of the second display region 222 can be the same, or be different.

Besides, the first display region 221 and the second display region 222 can commonly use a soldering pad region 24. The soldering pad region 24 is disposed at a side of the first display region 221. Of course, in another embodiment, the soldering pad region 24 is disposed at a side of the second display region 222.

In can be understood that each of the first display region 221 and the second display region 222 can have a soldering pad region 24. Wherein, the soldering pad region 24 of the first display region 221 and the soldering pad region 24 of the second display region 222 can be disposed at a same side or different sides of the first display region 221 and the second display region 222.

Besides, for conveniently bending and folding the folding region 23, the design of the folding region 23 can be improved. In the present embodiment, a thickness of the folding region 23 is less than a thickness of a region where the first display region 221 and the second display region 222 is located.

Figure 14:
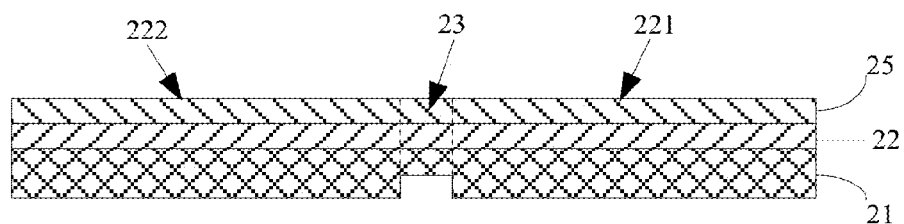
FIG. 14 is a schematic cross-sectional view of the double-side OLED display of a second embodiment of the present invention, which shows that the folding region includes the base layer, the OLED layer and the packaging layer, and the thickness of the substrate layer at the folding region is less than the thickness of the base layer at the other regions.

For example, the folding region 23 includes a base layer 21 and an OLED layer 22. A thickness of the substrate layer 21 at the folding region 23 is less than a thickness of the substrate layer 21 corresponding to the first display region 221 and the second display region 222. The above can be realized by thinning the substrate layer 21 at the folding region 23 such that the thickness of the substrate layer 21 at the folding region 23 is less than the thickness of the substrate layer 21 corresponding to the first display region 221 and the second display region 222 for conveniently bending. As shown in FIG. 14, and FIG. 14 is a schematic cross-sectional view of the double-side OLED display of a second embodiment of the present invention. As shown, the folding region includes the base layer, the OLED layer and the packaging layer, and the thickness of the substrate layer at the folding region is less than the thickness of the base layer at the other regions.

Figure 15:
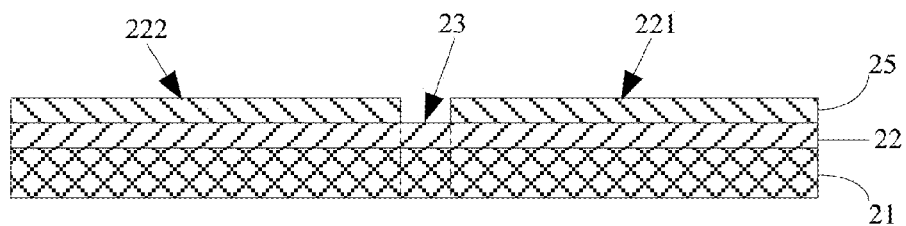
FIG. 15 is a schematic cross-section view of the double-side OLED display of the second embodiment of the present invention, which shows that the folding region includes a base layer and an OLED layer, and the thickness of the base layer of folding region is equal to the thickness of the base layer at the other regions.

Or, as shown in FIG. 15, and FIG. 15 is a schematic cross-section view of the double-side OLED display of the second embodiment of the present invention. As shown, the folding region includes a base layer and an OLED layer, and the thickness of the base layer of folding region is equal to the thickness of the base layer at the other regions. The folding region 23 only includes the base layer 21 and the OLED layer 22, a thickness of the base layer 21 corresponding to the folding region 23 is the same as a thickness of the base layer 21 corresponding to the first display region 221 and the second display region 222. The regions where the first display region 221 and the second display region 222 are located include the base layer 21, the OLED layer 22 and the packaging layer 25. Because the folding region 23 does not provide with the packaging layer 25, the thickness of the folding region 23 is less than the regions where the first display region 221 and the second display region 222 are located for conveniently bending.

Figure 16:
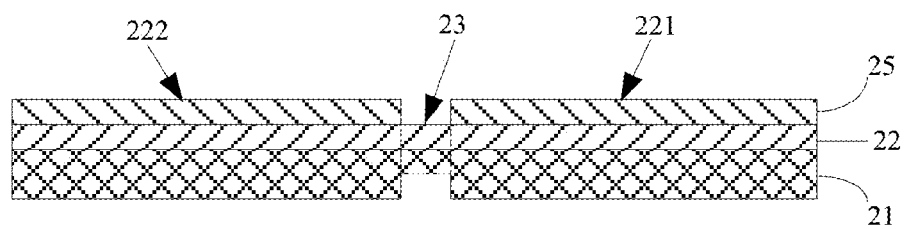
FIG. 16 is a schematic cross-section view of the double-side OLED display of the second embodiment of the present invention, which shows that the folding region only provides with the base layer and the OLED layer, and the thickness of the base layer at the folding region is less than the thickness of the base layer at the other regions.

Or, for conveniently bending, the present invention can reduce the thickness of the base layer 21 at the folding region 23 based on FIG. 15, as shown in FIG. 16. FIG. 16 is a schematic cross-section view of the double-side OLED display of the second embodiment of the present invention. As shown, the folding region only provides with the base layer and the OLED layer, and the thickness of the base layer at the folding region is less than the thickness of the base layer at the other regions.

Figure 17:
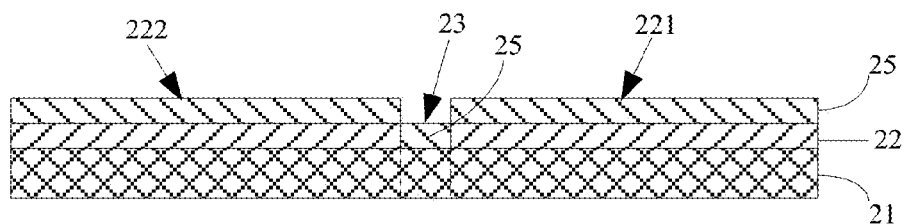
FIG. 17 is a schematic cross-sectional view of the double-side OLED display of the second embodiment of the present invention, which shows that the folding region includes the base layer and the packaging layer, and the thickness of the base layer of folding region is equal to the thickness of the base layer at the other regions.

Or, as shown in FIG. 17, and FIG. 17 is a schematic cross-sectional view of the double-side OLED display of the second embodiment of the present invention. As shown, the folding region includes the base layer and the packaging layer, and the thickness of the base layer of folding region is equal to the thickness of the base layer at the other regions. The folding region 23 only includes the base layer 21 and the packaging layer 25, a thickness of the base layer 21 corresponding to the folding region 23 is the same as a thickness of the base layer corresponding to the first display region 221 and the second display region 222. The regions where the first display region 221 and the second display region 222 are located include the base layer 21, the OLED layer 22 and the packaging layer 25. Because the folding region 23 does not provide with the OLED layer 22, the thickness of the folding region 23 is less than the regions where the first display region 221 and the second display region 222 are located for conveniently bending.

Figure 18:
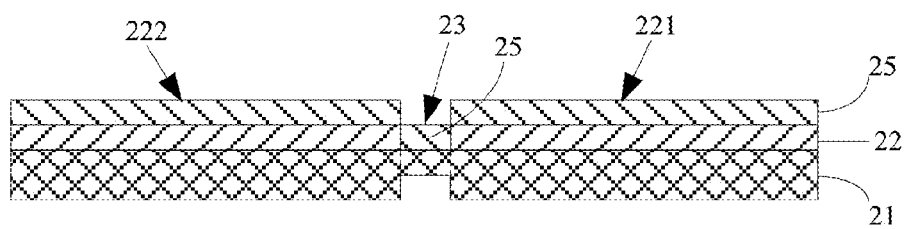
FIG. 18 is a schematic cross-section view of the double-side OLED display of the second embodiment of the present invention, which shows that the folding region only provides with the base layer and the packaging layer, and the thickness of the base layer at the folding region is less than the thickness of the base layer at the other regions.

Or, for conveniently bending, the present invention can reduce the thickness of the base layer 21 at the folding region 23 based on FIG. 17, as shown in FIG. 18. FIG. 18 is a schematic cross-section view of the double-side OLED display of the second embodiment of the present invention. As shown, the folding region only provides with the base layer and the packaging layer, and the thickness of the base layer at the folding region is less than the thickness of the base layer at the other regions.

Figure 19:
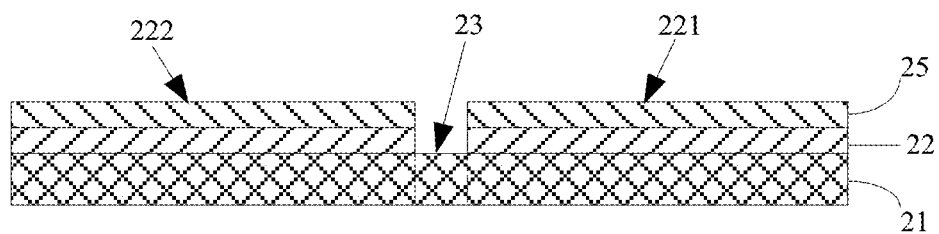
FIG. 19 is a schematic cross-section view of the double-side OLED display of the second embodiment of the present invention, which shows that the folding region only includes a base layer, and the thickness of the base layer of folding region is equal to the thickness of the base layer at the other regions.

Or, as shown in FIG. 19, and FIG. 19 is a schematic cross-section view of the double-side OLED display of the second embodiment of the present invention. As shown, the folding region only includes a base layer, and the thickness of the base layer of folding region is equal to the thickness of the base layer at the other regions. The folding region 23 only includes the base layer 21, a thickness of the base layer 21 corresponding to the folding region 23 is the same as a thickness of the base layer 21 corresponding to the first display region 221 and the second display region 222. The regions where the first display region 221 and the second display region 222 are located include the base layer 21, the OLED layer 22 and the packaging layer 25. Because the folding region 23 does not provide with the OLED layer 22 and the packaging layer 25, the thickness of the folding region 23 is less than the regions where the first display region 221 and the second display region 222 are located for conveniently bending.

Figure 20:
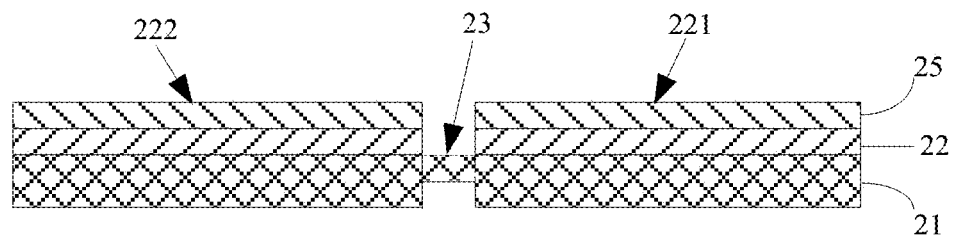
FIG. 20 is a schematic cross-sectional view of the double-side OLED display of the second embodiment of the present invention, which shows that the folding region includes the base layer, and the thickness of the base layer at the folding region is less than the thickness of the base layer at the other regions.

Or, for conveniently bending, the present invention can reduce the thickness of the base layer 21 at the folding region 23 based on FIG. 19, as shown in FIG. 20. FIG. 20 is a schematic cross-sectional view of the double-side OLED display of the second embodiment of the present invention. As shown, the folding region includes the base layer, and the thickness of the base layer at the folding region is less than the thickness of the base layer at the other regions.

It should be noted that, in the above embodiments, the double-side OLED display is simplified as three structures of the base layer, the OLED layer and the packaging layer.

The three structure can includes every parts required by the display. Although the embodiments of the present invention only introduce a portion of structure and parts of the OLED display, the present invention is not limited. For example, the base layer can be a thin glass, metal, plastic material and so on. The base layer can be a flexible substrate (such as PI organic material or a mixed structure formed by organic and inorganic material). The OLED layer includes TFT control switches, light-emitting material. The TFT is formed by amorphous silicon, low-temperature single-crystal silicon technology. The TFT can also be a bottom gate type or a top gate type. The light-emitting material can be an organic material or an inorganic material for various applications. The packaging layer can be a thin-film packaging or a cover packaging or a combined packaging structure formed by the thin-film packaging and the cover packaging. The OLED display further includes other display parts such as a packaging plastic layer, and the packaging plastic layer is connected to a base and a packaging cover to block moisture.

In summary, the present invention can simplify the production process, increase the production capacity, decrease the thickness of the product, and sufficiently utilizing the base layer such that the base layer can protect the OLED layer. Besides, because the displaying at both sides is emitting at a bottom, the base layer located at outside can provide a flat display surface to improve the display quality.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A double-side OLED display, comprising:
   a base layer having a first end and a second end; and
   an OLED layer disposed on the base layer, wherein the OLED layer includes a first display region and a second display region; and
   a folding region disposed between the first display region and the second display region of the OLED layer;
   wherein, the base layer and the OLED layer are folded such that the first display region and the second display region respectively face toward opposite directions; the base layer is located at an outside;
   wherein, a terminal of the double-side OLED display opposite to the folding region is fixed with a packaging material for performing a packaging to the double-side OLED display;
   wherein, the packaging material is disposed at a terminal of the first display region away from the folding region and is disposed at a terminal of the second display region away from the folding region; and
   wherein, the packaging material is disposed between the first end and the second end of the base layer.

2. The double-side OLED display according to claim 1, wherein, before the base layer and the OLED layer are folded, the first display region and the second display region are arranged adjacently; the folding region is disposed between the first display region and the second display region for folding along the folding region.

3. The double-side OLED display according to claim 2, wherein, a packaging layer is disposed on the OLED layer, and the packaging material is fixed at a terminal of the packaging layer, and the base layer and the packaging material commonly enclose the OLED layer.

4. The double-side OLED display according to claim 2, wherein, the packaging material is fixed between the packaging layer corresponding to the first display region and the packaging layer corresponding to the second display region.

5. The double-side OLED display according to claim 3, wherein, a drier is disposed between the packaging layer and the packaging material.

6. The double-side OLED display according to claim 4, wherein, a drier is disposed between the packaging layer and the packaging material.

7. The double-side OLED display according to claim 1, wherein, a thickness of the folding region is less than a thickness of a region where the first display region and the second display region is located.

8. The double-side OLED display according to claim 7, wherein, a thickness of the base layer at the folding region is less than a thickness of the base layer corresponding to the first display region and the second display region.

9. The double-side OLED display according to claim 8, wherein, an area of the first display region and an area of the second display region are the same, or;
   the area of the first display region and the area of the second display region are different.

10. The double-side OLED display according to claim 9, wherein, the first display region and the second display region commonly use a soldering pad region for connecting with a flexible circuit board; the soldering pad region is disposed at a side of the first display region or disposed at a side of the second display region.

11. The double-side OLED display according to claim 10, wherein, each of the first display region and the second display region has a soldering pad region; the soldering pad region of the first display region is a first soldering pad region; the soldering pad region of the second display region is a second soldering pad region; the first soldering pad region and the second soldering pad region are disposed at a same side of the first display region and the second display region or different sides.

12. The double-side OLED display according to claim 1, wherein, a drier is disposed between the first display region and the second display region.

* * * * *